United States Patent
Mizuno

(10) Patent No.: US 10,070,565 B2
(45) Date of Patent: Sep. 4, 2018

(54) ELECTRIC POWER CONVERTER

(71) Applicant: DENSO CORPORATION, Kariya, Aichi-pref. (JP)

(72) Inventor: Yukinori Mizuno, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/883,034

(22) Filed: Oct. 14, 2015

(65) Prior Publication Data

US 2016/0106011 A1   Apr. 14, 2016

(30) Foreign Application Priority Data

Oct. 14, 2014   (JP) .................................. 2014-209963

(51) Int. Cl.
    *H05K 7/20*   (2006.01)

(52) U.S. Cl.
    CPC ................................ *H05K 7/20927* (2013.01)

(58) Field of Classification Search
    CPC .............................. H05K 7/20; H05K 7/20927
    USPC ............... 361/699, 717, 709, 718, 735, 820; 257/718
    See application file for complete search history.

(56) References Cited

U.S. PATENT DOCUMENTS

| | | | | |
|---|---|---|---|---|
| 7,891,187 B2 * | 2/2011 | Mohr | ................. | F28D 20/0056 60/641.2 |
| 2005/0259402 A1 * | 11/2005 | Yasui | ................... | H02M 7/003 361/716 |
| 2013/0003301 A1 * | 1/2013 | Miyamoto | ............ | H01L 23/473 361/699 |
| 2013/0027164 A1 | 1/2013 | Ooyama | | |
| 2013/0033913 A1 * | 2/2013 | Sparka | ................... | H01G 4/228 363/132 |
| 2013/0058068 A1 | 3/2013 | Funatsu | | |
| 2014/0153189 A1 * | 6/2014 | Okamura | ............. | H05K 1/0213 361/688 |
| 2014/0284765 A1 * | 9/2014 | Kiuchi | ................... | H01L 28/40 257/532 |
| 2015/0256096 A1 | 9/2015 | Nishizawa et al. | | |

(Continued)

FOREIGN PATENT DOCUMENTS

| | | |
|---|---|---|
| JP | 2013-030623 A | 2/2013 |
| JP | 2013-055840 A | 3/2013 |
| JP | 2013-146118 A | 7/2013 |

(Continued)

*Primary Examiner* — Mandeep S Buttar
(74) *Attorney, Agent, or Firm* — Oliff PLC

(57) ABSTRACT

An electric power converter includes a laminated body, a capacitor, a case, and a pressing member. The laminated body is formed by laminating semiconductor modules and cooling pipes. The pressing member presses the laminated body in a laminating direction of the laminated body. The case has outer wall portions that form an outer shell, and partition wall portions formed in the case and are connected to the outer wall portions. The capacitor has capacitor elements and a sealing member. The sealing member is filled in a capacitor housing space in a state where the capacitor elements are sealed. Pressing force of the pressing member is applied to an interposing partition wall portion interposing between the laminated body and the capacitor among the partition wall portions. A thickness of the interposing partition wall portion is made thinner than any other parts of the outer wall portions.

2 Claims, 10 Drawing Sheets

(56) References Cited

U.S. PATENT DOCUMENTS

2015/0271933 A1* 9/2015 Kaneko ................ H05K 1/0203
361/690

FOREIGN PATENT DOCUMENTS

| JP | 2014-011943 A | 1/2014 |
| JP | 2014-027768 A | 2/2014 |
| JP | 2014-079030 A | 5/2014 |

* cited by examiner

ELECTRIC POWER CONVERTER

CROSS-REFERENCE TO RELATED APPLICATION

This application is based on and claims the benefit of priority from earlier Japanese Patent Application no. 2014-209963 filed Oct. 14, 2014, the description of which is incorporated herein by reference.

TECHNICAL FIELD

The present disclosure relates to an electric power converter that has a semiconductor module with a built-in semiconductor element and a capacitor connected to the semiconductor module.

BACKGROUND

As an electric power converter that performs power conversion between DC power and AC power, one that has a laminated body obtained by laminating a plurality of semiconductor modules with built-in semiconductor elements and a plurality of cooling pipes for cooling the semiconductor module, and that houses the laminated body in a metal casing has been known (refer to Japanese Patent Application Laid-Open Publication No. 2013-55840).

In the abovementioned electric power converter, a pressing member such as a leaf spring is housed in the metal casing. The laminated body is pressurized in a laminating direction by the pressing member. Thereby, it is configured that while ensuring a contact pressure between the semiconductor modules and the cooling pipes, the laminated body is fixed in the metal casing. Moreover, a capacitor connected to the semiconductor modules is housed in the metal casing.

The metal casing includes outer wall portions that form an outer shell, and partition wall portions formed in the case, which are connected to the outer wall portions. A space within the metal casing is partitioned into a capacitor housing space for housing the capacitor and a laminated body housing space for housing the laminated to body by the partition walls. The pressing force of the pressing member is applied to the partition walls.

The capacitor includes a capacitor case made of resin, capacitor elements disposed in the capacitor case, and a sealing member for sealing the capacitor elements in the capacitor case. The capacitor is housed in the capacitor housing space. A gap is formed between the capacitor case and the metal casing (refer to FIG. 10).

However, the above-mentioned electric power converter has a problem that cooling performance of the capacitor is not sufficiently high. That is, as described above, in the above-mentioned electric power converter, the capacitor elements are sealed in the capacitor case, and the gap is formed between the capacitor case and the metal casing. Thereby, the heat generated from the capacitor elements is transmitted to the metal casing via the sealing member, the capacitor case, and the gap. Therefore, a thermal resistance from the capacitor elements to the metal casing is large, and it is impossible to increase sufficiently the cooling performance of the capacitor.

Further, since there is the gap between the partition wall and the capacitor in the electric power converter, it is necessary to receive the pressing force of the pressing member on the partition wall. Therefore, in order not to cause it to deform due to the pressing force, it is necessary to form the partition wall thickly. Thus, there is a problem that it is difficult to lighten the electric power converter. Further, when the partition wall is thick, it becomes difficult to reduce the size of the metal casing, which makes it difficult to downsize the electric power converter.

SUMMARY

An embodiment provides an electric power converter that can be downsized and lightened, while capable of improving cooling efficiency of a capacitor.

In an electric power converter according to a first aspect includes a laminated body formed by laminating a plurality of semiconductor modules having built-in semiconductor elements and a plurality of cooling pipes for cooling the semiconductor modules alternately, a capacitor connected to the plurality of semiconductor modules, a pressing member that presses the laminated body in a laminating direction of the laminated body, and a metal case that houses the laminated body, the capacitor, and the pressing member.

The case has outer wall portions that form an outer shell, and partition wall portions formed in the case that are connected to the outer wall portions, a space within the case being partitioned by the partition wall portions into a capacitor housing space for housing the capacitor and a laminated body housing space for housing the laminated body, the capacitor including capacitor elements housed in the capacitor housing space, and a sealing member that is filled in the capacitor housing space for sealing the capacitor elements, the capacitor being disposed at a position adjacent to the laminated body in the laminating direction, pressing force of the pressing member being applied to an interposing partition wall portion interposing between the laminated body and the capacitor among the partition well portions in its thickness direction, and a thickness of the interposing partition wall portion is made thinner than any other parts of the outer wall portions.

In the above-mentioned electric power converter, the capacitor housing space is filled with the sealing member. Thus, the sealing member can be brought into contact with the partition wall portions and the outer wall portions of the case. Therefore, the heat generated from the capacitor can be transmitted immediately to the metal case via the sealing member. As a result, it is possible to reduce the thermal resistance from the capacitor elements to the case, thus it is possible to enhance the cooling efficiency of the capacitor.

Further, in the above-mentioned electric power converter, the interposing partition wall portion interposed between the capacitor and the laminated body among the partition wall portions is formed thinner than any other parts of the outer wall portions. Therefore, it is possible to downsize and lighten the case. In the above electric power converter, since the capacitor housing space is filled with the sealing member, it is possible to bring the sealing member to contact with the interposing partition wall portion. Thus, there is no gap present between the sealing member and the interposing partition wall portion, and even when the pressing force of the pressing member is applied to the interposing partition wall portion, the pressing force can be received by the sealing member. Therefore, it is possible to make the interposing partition wall portion thin, and it is possible to achieve downsizing and lightening of the case.

As described above, according to the present disclosure, it is possible to provide the electric power converter that can further be lightened and downsized, and capable of improving the cooling efficiency of the capacitor.

DETAILED DESCRIPTION OF THE PREFERABLE EMBODIMENT

An above-mentioned electric power converter can be defined as an on-vehicle electric power converter for mounting on a vehicle such as an electric vehicle or a hybrid vehicle.

EMBODIMENTS

First Embodiment

Figure 1:
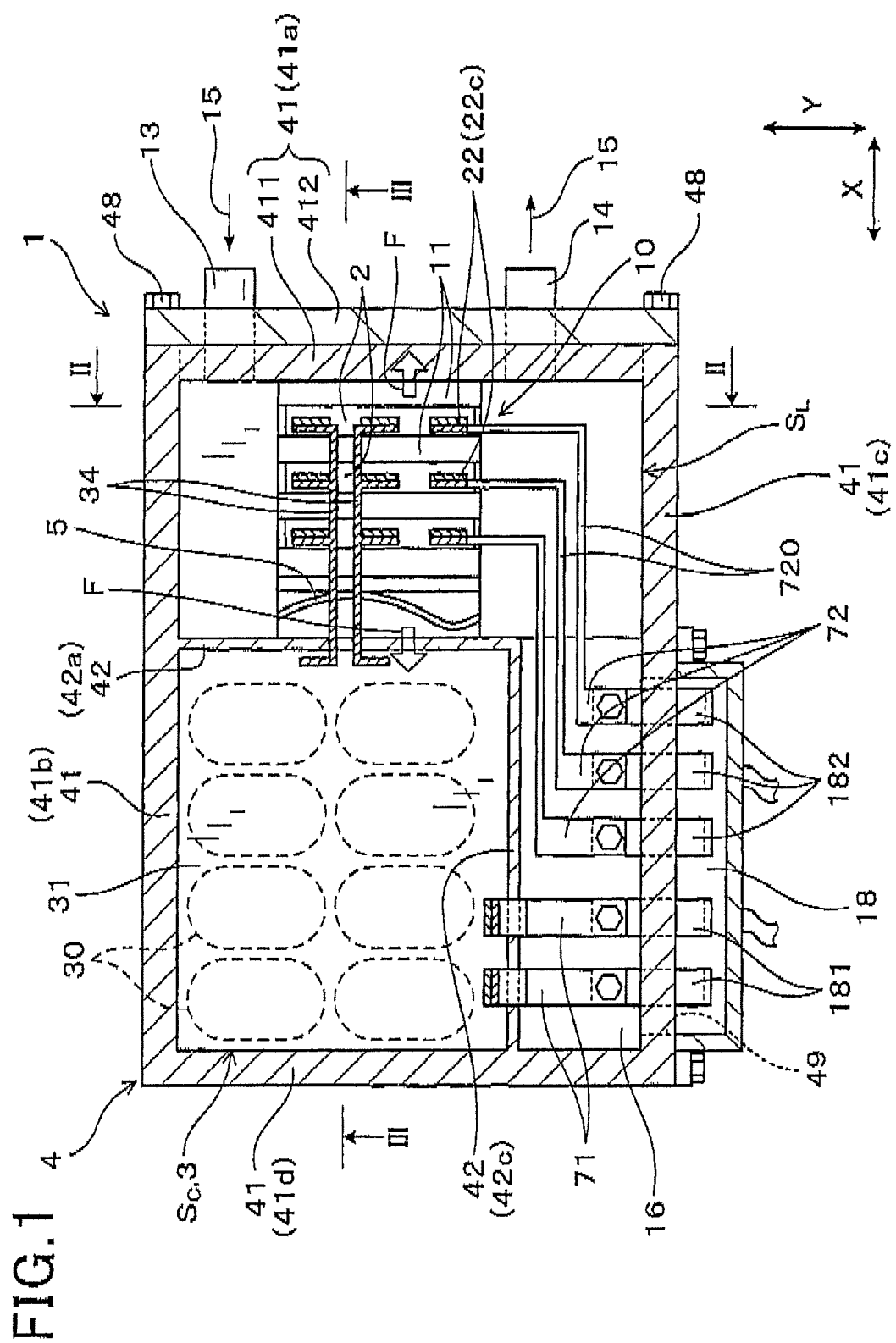
FIG. 1 shows a sectional view of an electric power converter, and is a sectional view taken along the line I-I of FIG. 2 in a first embodiment.

An embodiment according to an electric power converter will be described with reference to FIGS. 1 to 6. As shown in FIG. 1, an electric power converter 1 of the present embodiment includes a laminated body 10, a capacitor 3, a metal case 4, and a pressing member 5. The laminated body 10 is formed by laminating a plurality of semiconductor modules 2 having built-in semiconductor elements 20 (refer to FIG. 6) and a plurality of cooling pipes 11 for cooling the semiconductor modules 2 alternately. The capacitor 3 is connected to the semiconductor modules 2.

The pressing member 5 presses the laminated body 10 in a laminating direction of the laminated body 10 (X-direction). Thereby, while ensuring a contact pressure between the semiconductor modules 2 and the cooling pipes 11, the laminated body 10 is fixed in the case 4. The above-mentioned laminated body 10, the capacitor 3, so and the pressing member 5 are housed in the case 4.

The case 4 has outer wall portions 41 that form an outer shell, and partition wall portions 42 formed in the case 4 and are connected to the outer wall portions 41. A space within the case 4 is partitioned by the partition wall portions 42 into a capacitor housing space $S_C$ for housing the capacitor 3 and a laminated body housing space $S_L$ for housing the laminated body.

The capacitor 3 includes capacitor elements 30 housed in the capacitor housing space $S_C$, and a sealing member 31 that is filled in the capacitor housing space $S_C$ for sealing the capacitor elements 30.

The capacitor 3 is disposed at a position adjacent to the laminated body 10 in the X direction. Pressing force of the pressing member 5 is applied to an interposing partition wall portion 42a interposing between the laminated body 10 and the capacitor 3 among the partition wall portions 42 in its thickness direction (X direction). The thickness of the interposing partition wall portion 42a is made thinner than any other parts of the outer wall portions 41.

The electric power converter 1 of the present embodiment is an on-vehicle electric power converter for mounting on a vehicle such as an electric vehicle or a hybrid vehicle.

Figure 6:
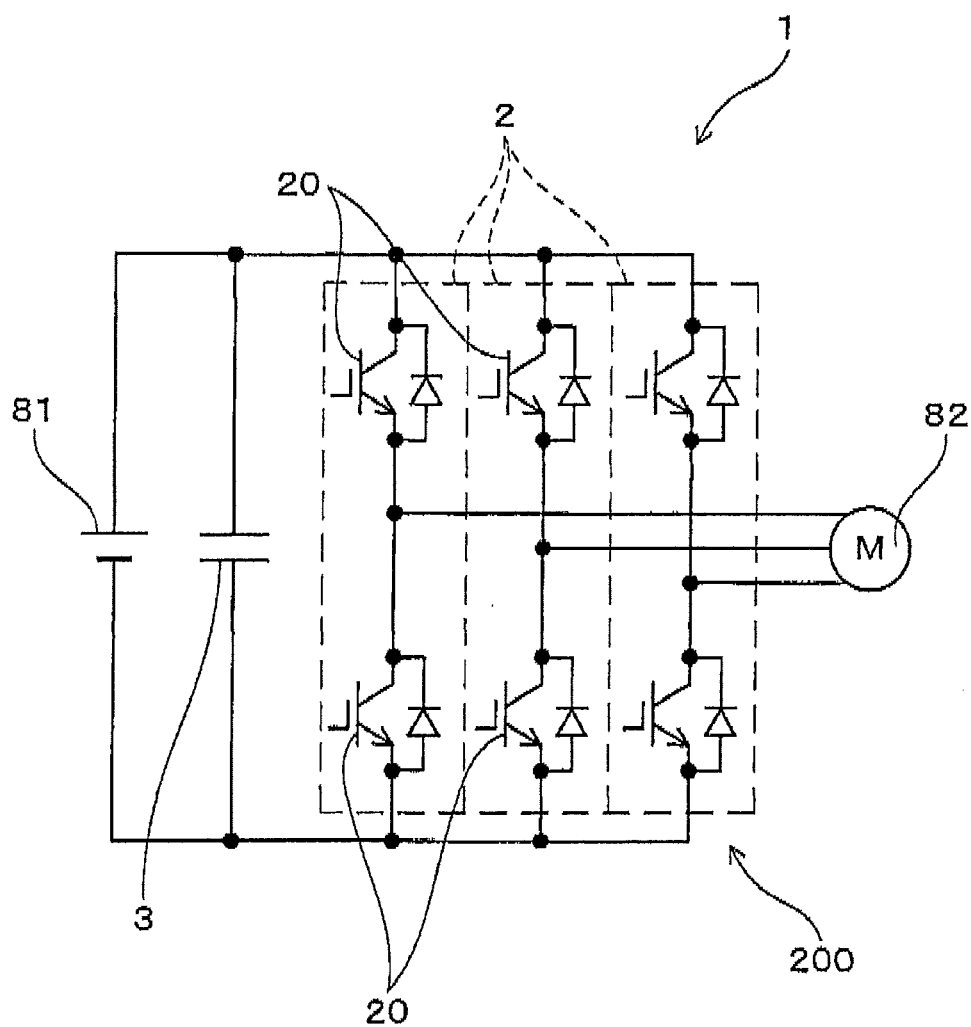
FIG. 6 shows a circuit diagram of the electric power converter in the first embodiment.

As shown in FIG. 6, an inverter circuit 200 is constituted by a plurality of semiconductor modules 2 in the present embodiment. DC power supplied from a DC power supply 81 is converted into AC power by turning on and off the semiconductor elements 20 (IGBT elements) in the semiconductor modules 2. Then, a three-phase AC motor 82 is driven by using the obtained AC power, thereby drives the vehicle.

The capacitor 3 is connected to the semiconductor modules 2. DC voltage applied to the semiconductor modifies 2 is smoothened by using the capacitor 3.

Figure 3:
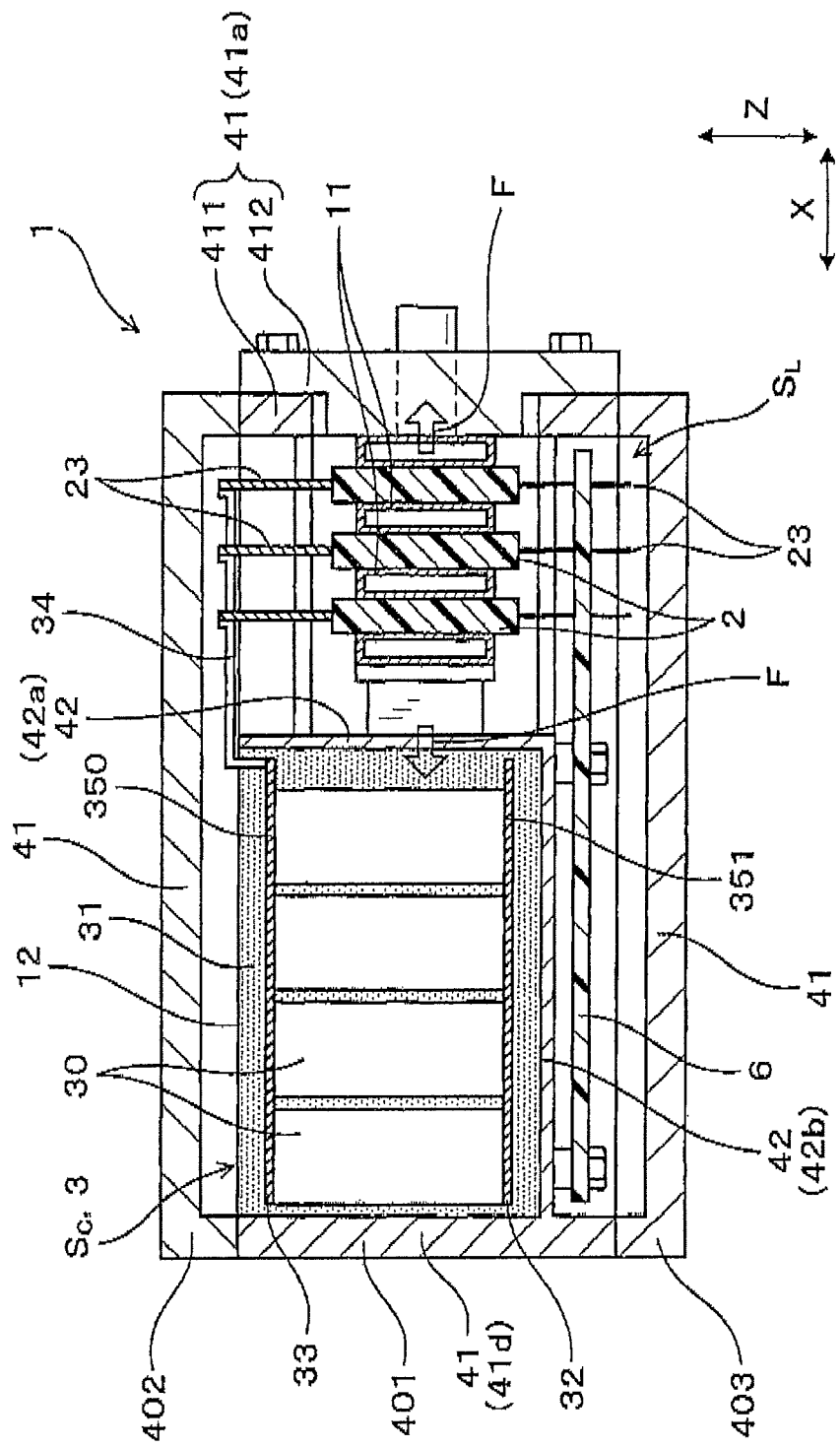
FIG. 3 shows a sectional view taken along the line III-III of FIG. 1.
Figure 4:
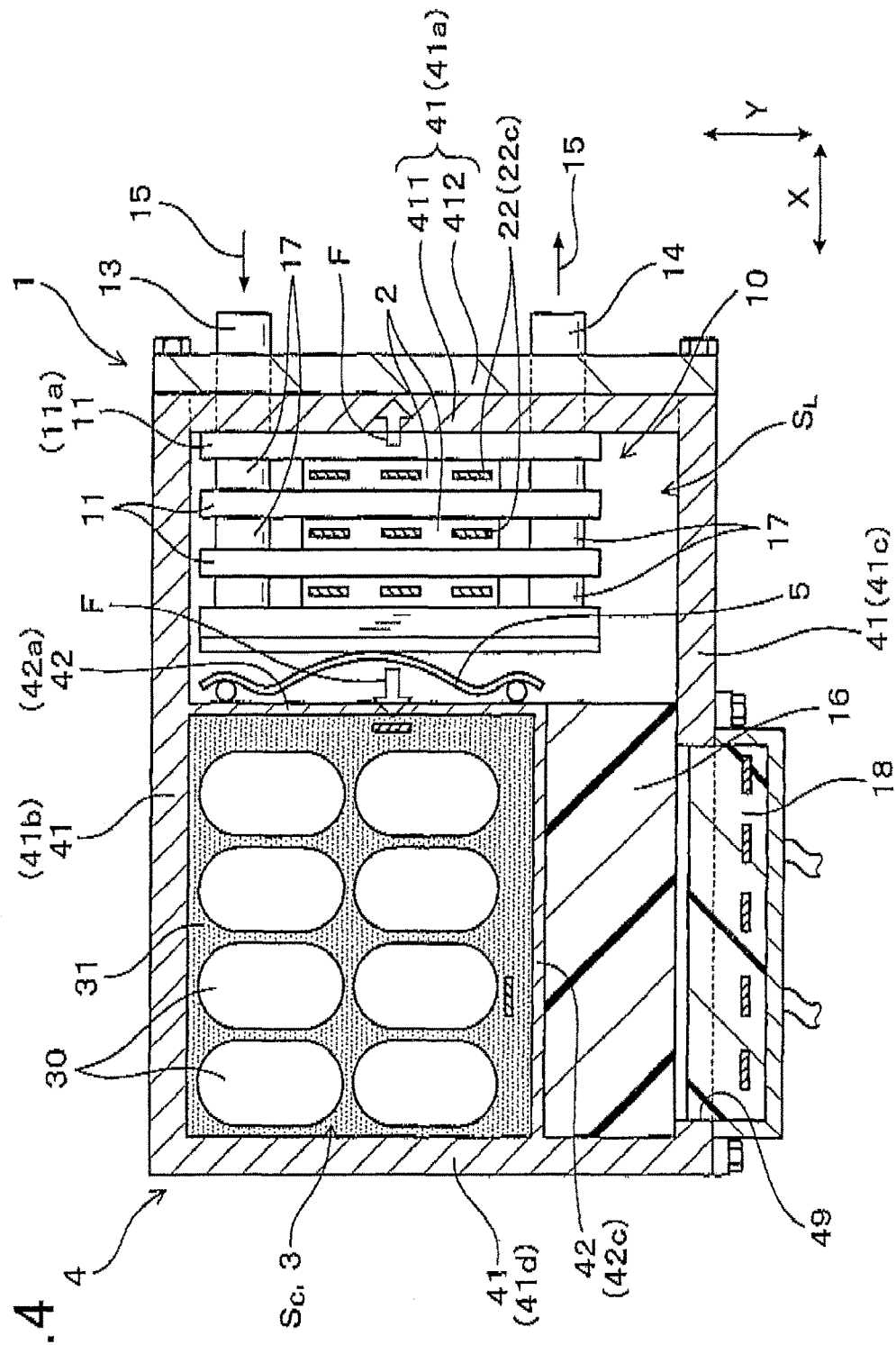
FIG. 4 shows a sectional view taken along the line IV-IV of FIG. 2.

As shown in FIG. 3 and FIG. 4, the electric power converter 1 of the present embodiment includes the interposing partition wall portion 42a, a bottom partition wall portion 42b, and a lateral partition wall portion 42c as the partition wall portions 42. The bottom partition wall portion 42b is orthogonal to the interposing partition wall portion 42a. The bottom partition wall portion 42b is disposed on a side opposite to an opening 12 of the capacitor housing space $S_C$.

Further, the lateral partition wall portion 42c is orthogonal to both the interposing partition wall portion 42a and the bottom partition wall portion 42b. In the present embodiment, a space surrounded by the interposing partition wall portion 42a, the bottom partition wall portion 42b, the lateral partition wall portion 42c, and the outer wall portions 41 is defined as the capacitor housing space $S_C$.

The thicknesses of the interposing partition wall portion 42a, the bottom partition wall portion 42b, and the lateral partition wall portion 42c are made thinner than any other parts of the outer wall portions 41.

As described above, in the present embodiment, the space in the case 4 is divided into the capacitor housing space $S_C$ and the laminated body housing space $S_L$ by the partition wall portions 42 (42a~42c). In addition to the laminated body 10, a control circuit board 6 and a terminal block 16 are housed in the laminated body housing space SL.

As shown in FIG. 3 and FIG. 4, the capacitor 3 includes the capacitor elements 30 housed in the capacitor housing space SC, the sealing member 31 for sealing the capacitor elements 30 in the capacitor housing space SC, and electrode plates 32, 33 connected to the capacitor elements 30. The capacitor elements 30 are so-called film capacitors.

The sealing member 31 is made of a thermosetting resin such as epoxy resin. The sealing member 31 fills gaps between the capacitor elements 30, the electrode plates 32, 33, and the case 4 in the capacitor housing space $S_C$. Thereby, the capacitor elements 30 and the electrode plates 32, 33 are sealed. The electrode plates 32, 33 are connected to electrode surfaces 350, 351 of the capacitor elements 30. Parts of the electrode plates 32, 33 protrude from the sealing member 31. The electrode plates 32, 33 are integrated with DC bus bars 34p, 34n which will be described later.

When manufacturing the capacitor 3, the capacitor elements 30 are housed into the capacitor housing space SC, then uncured sealing member 31 is injected. Then, heat is applied to cure the sealing member 31. Thereby, the capacitor 3 is manufactured.

Meanwhile, as shown in FIG. 4, the pressing member 5 is disposed in the X direction between the laminated body 10 and the interposing partition wall portion 42a in the present embodiment. The pressing member 5 of the present embodiment is a leaf spring. The laminated body 10 is pressed toward the outer wall portion 41a of the case 4 by the pressing member 5. The pressing force F of the pressing member 5 is applied to the interposing partition wall portion 42a and the capacitor 3.

Two cooling pipes 11 adjacent in the X direction are connected by connecting pipes 17 at both end portions thereof in a longitudinal direction of the cooling pipe 11 (Y-direction). Furthermore, an inlet pipe 13 for introducing a refrigerant 15 and an outlet pipe 14 for discharging the refrigerant 15 are connected to an end cooling pipe 11a positioned at one end in the X direction among the plurality of cooling pipes 11. When introducing the refrigerant 15 from the inlet pipe 13, the refrigerant 15 flows all of the cooling pipes 11 through the connecting pipes 17, and discharged from the outlet pipe 14. Thereby, the semiconductor modules 2 are cooled.

Figure 2:
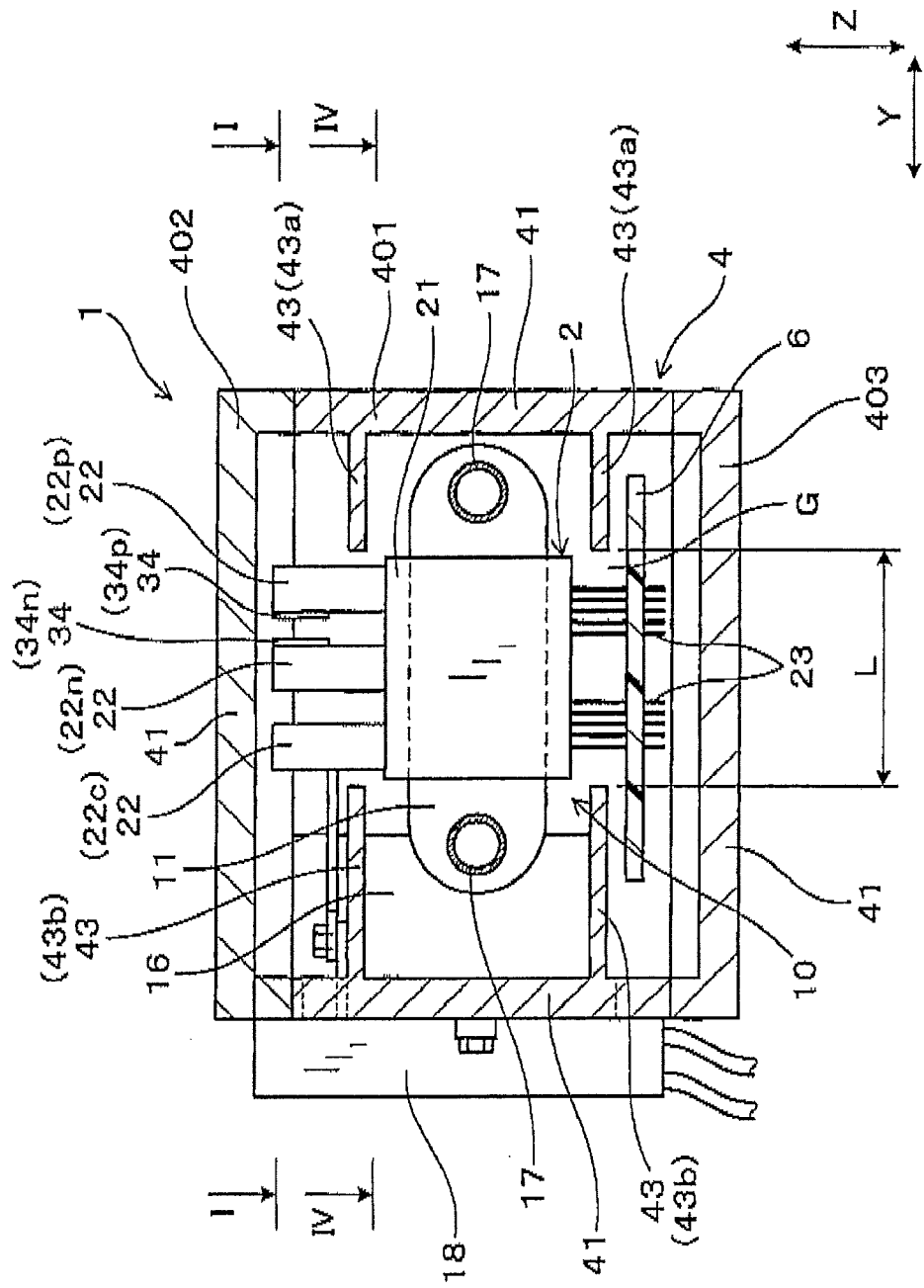
FIG. 2 shows a sectional view taken along the line II-II of FIG. 1.

As shown in FIG. 2, the respective semiconductor module 2 has a main body 21 with a built-in semiconductor element 20, and power terminals 22 and control terminals 23 protruding from the main body 21. As the power terminals 22, there are DC terminals 22p, 22n to which DC voltage is applied, and there are AC terminals 22c connected to the three-phase AC motor 82 (refer to FIG. 6). The DC terminals 22p, 22n are connected to the capacitor 3 via the DC bus bars 34p, 34n.

The control terminals 23 are connected to the control circuit board 6. An on-off operation of the semiconductor element 20 (refer to FIG. 6) is controlled by the control circuit board 6. Thereby, the DC power supplied from the DC power supply 81 is converted into the AC power.

As shown in FIG. 1, the electric power converter 1 includes input terminals 71 for being connected to the DC power supply 81 (refer to FIG. 6), and output terminals 72 for being connected to the three-phase AC motor 82. The input terminals 71 are connected to the capacitor 3. Further, AC bus bars 720 are connected to the AC terminal 22c of the semiconductor modules 2. Ends of the AC bus bars 720 are the aforementioned output terminals 72.

As shown in FIG. 1 and FIG. 4, the terminal block 16 for mounting the input terminals 71 and output terminals 72 are housed in the case 4. The terminal block 16 is made of resin. The terminal block 16 is disposed at a position adjacent to the capacitor 3 in the Y direction.

Figure 5:
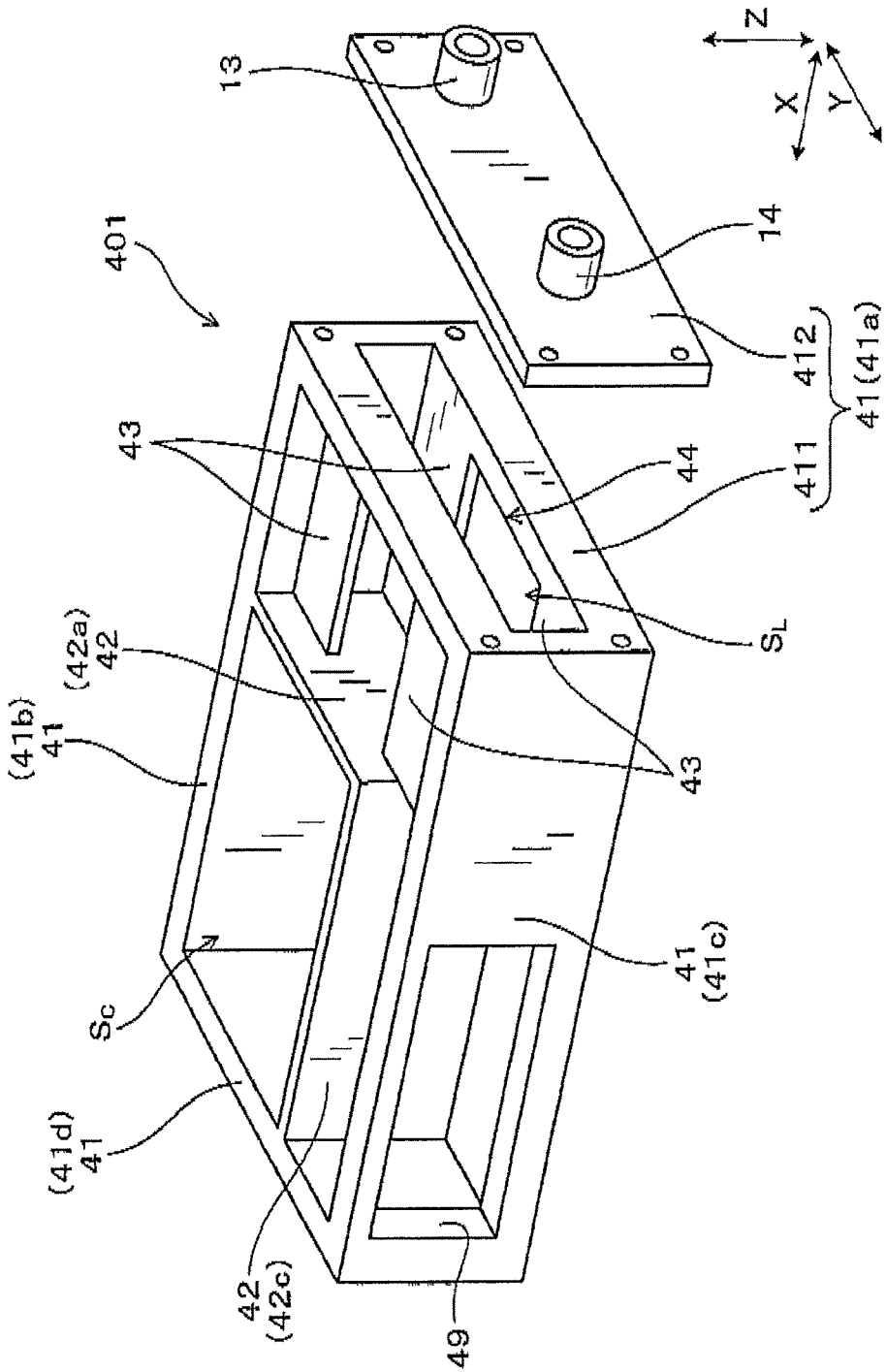
FIG. 5 shows an exploded perspective view of a case main body in the first embodiment.

As shown in FIG. 1 and FIG. 5, a connector insertion hole 49 is formed in the outer wall portion 41 of the case 4. The connector insertion hole 49 penetrates in the Y direction. A connector 18 is inserted into the connector insertion hole 49. Input connector terminals 181 of the connector 18 are connected to the input terminals 71 of the electric power converter 1. In addition, output connector terminals 182 of the connector 18 are connected to the output terminals 72. The electric power converter 1 is electrically connected to the DC power supply 81 and the three-phase AC motor 82 via the connector 18.

As shown in FIG. 2 and FIG. 3, the case 4 of the present embodiment includes a case main body 401 for housing the laminated body 10 and the capacitor 3, and covers 402, 403 attached to the case main body 401. The covers 402, 403 also constitute the outer wall portions 41 of the case 4.

As shown in FIG. 5, a plurality of reinforcing wall portions 43 are formed to the case main body 401 in addition to the partition wall portions 42. A rigidity of the case 4 has been increased by the reinforcing wall portions 43. Thus, the case 4 is configured not to be deformed by the pressing force F of the pressing member 5 (see FIG. 4).

Further, among the outer wall portions 41 of the case 4, the outer wall portion 41a to which the inlet pipe 13 and so the outlet pipe 14 are disposed has a double structure in which a first outer wall portion 411 and a second outer wall portion 412 are overlapped with each other. The first outer wall portion 411 is positioned on an inside of the case 4, while the second outer wall portion 412 is positioned on an outside of the case 4. A through hole 44 penetrating in the X direction is formed in the first outer wall portion 411. The through hole 44 is closed by the second outer wall portion 412. The second outer wall portions 412 is fixed to the first outer wall portion 411 by bolts 48.

As shown in FIG. 2, a distance L in the Y direction between the two reinforcing wall portions 43a, 43b adjacent in the Y direction is shorter than the length of the cooling pipe 11 in the Y-direction. Therefore, when manufacturing the electric power converter 1, it is not possible to put the cooling pipes 11 in the case 4 through a gap G formed between the two reinforcing wall portions 43a, 43b. Therefore, the cooling pipes 11 are configured to be placed in the case 4 from the through hole 44 in the present embodiment.

Functions and effects of the present embodiment will be described. As shown in FIG. 1 and FIG. 3, the capacitor housing space $S_C$ is filled with the sealing member 31 in the present embodiment. Thus, the sealing member 31 can be brought into contact with the partition wall portions 42 and the outer wall portions 41 of the case 4. Therefore, heat generated from the capacitor elements 30s can be transmitted immediately to the metal case 4 via the sealing member 31. As a result, it is possible to reduce the thermal resistance from the capacitor elements 30 to the case 4, and thus it is possible to enhance the cooling efficiency of the capacitor 3.

Further, among the partition wall portions 42, the interposing partition wall portion 42a interposing between the capacitor 3 and the laminated body 10 is made thinner than any other parts of the outer wall portions 41 in the present embodiment. Therefore, it is possible to downsize the case 4, and it can be lightened. Since the capacitor housing space $S_C$ is filled with the sealing member 31 in the present embodiment, it is possible to bring the sealing member 31 to contact with the interposing partition wall portion 42a. Thus, there is no gap present between the sealing member 31 and the interposing partition wall portion 42a, and even when the pressing force F of the pressing member 5 is applied to the interposing partition wall portion 42a, the pressing force F can be received by the sealing member 31. Therefore, it is possible to make the interposing partition wall portion 42a thin, and it is possible to achieve downsizing and lightening of the case 4.

Figure 10:
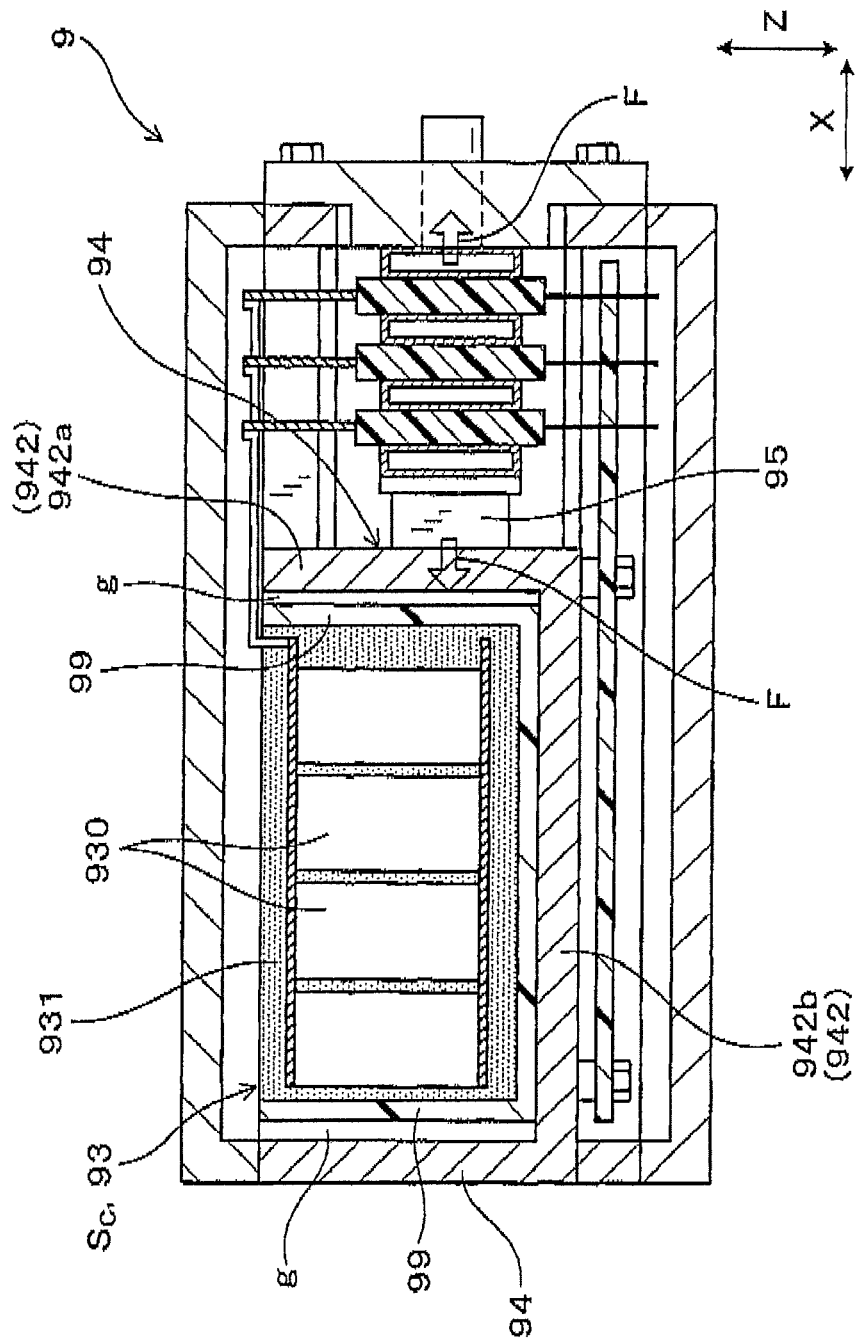
FIG. 10 shows a sectional view of an electric power converter in a comparative example.

As shown in FIG. 10, assuming that a capacitor 93 is constituted by sealing capacitor elements 930 in a capacitor case 99, it is necessary to form a capacitor housing space $S_C$ slightly larger in order to house the capacitor 93 easily. Thereby, a gap g is formed between the capacitor 93 and a case 94 as a result. Therefore, heat generated from the capacitor elements 930 will be transmitted to the case 94 via a sealing member 931, the capacitor case 99, and the gap g. As a result, the thermal resistance from the capacitor elements 930 to the case 94 becomes large, and it becomes difficult to sufficiently enhance the cooling efficiency of the capacitor 93.

In addition, when the gap g is formed, the pressing force F of a pressing member 95 is needed to be received by an interposing partition wall 942a. Therefore, in order not to be deformed by the pressing force F, the interposing partition wall portion 942a is needed to be formed thicker. Thus, the case 94 becomes large, and it tends to become heavy.

In contrast, as shown in FIG. 3, since the sealing member 31 comes into contact with the partition well portions 42 and the like of the case 4 by filling the capacitor housing space $S_C$ with the sealing member 31 as in the present embodiment, the heat generated from the capacitor elements 30 is transmitted immediately to the case 4 via the sealing member 31. Therefore, it is possible to enhance the cooling efficiency of the capacitor 3. Further, since no gap is formed between the sealing member 31 and the interposing partition wall portion 42a, the pressing force F of the pressing member 5 applied to the interposing partition wall portion 42a can be received by the sealing member 31. Therefore, it is possible, to make the interposing partition wall portion 42a thinner, thus the case 4 can be downsized and lightened.

Furthermore, as shown in FIG. 1 and FIG. 3, in addition to the interposing partition wall portion 42a, the bottom partition wall portion 42b and the lateral partition wall portion 42c are also made thinner than any other parts of the outer wall portions 41 in the present embodiment. Therefore, the case 4 can be more lightened, and can be more downsized. As a result, the electric power converter 1 can be lightened and downsized.

In addition, as shown in FIG. 1 and FIG. 3, a supporting outer wall portion 41d disposed in a position farther from the laminated body 10 than the capacitor 3 is in the X direction is provided as the outer wall portion 41 in the present embodiment. The sealing member 31, of the capacitor 3 is in contact with the supporting outer wall portion 41d. Therefore, the pressing force F of the pressing member 5 applied to the sealing member 31 can be received by the supporting outer wall portions 41d which is thicker than the partition wall portions 42.

As described above, according to the present disclosure, it is possible to provide the electric power converter what while further capable of being lightened and downsized, improves the cooling efficiency of the capacitor.

Incidentally, as shown in FIG. 4, although the pressing member 5 is disposed between the laminated body 10 and the interposing partition wall portion 42a in the present embodiment, the present disclosure is not limited thereto. That is, the pressing member 5 can also be disposed between the laminated body 10 and the outer wall portion 41a. In this case, the pressing member 5 is to press the laminated body 10 toward the interposing partition wall portion 42a.

Second Embodiment

In the following embodiments, among the reference numerals used in the drawings, ones having the same reference numerals as used in the first embodiment represent the same constituent elements as the first embodiment unless otherwise indicated.

Figure 7:
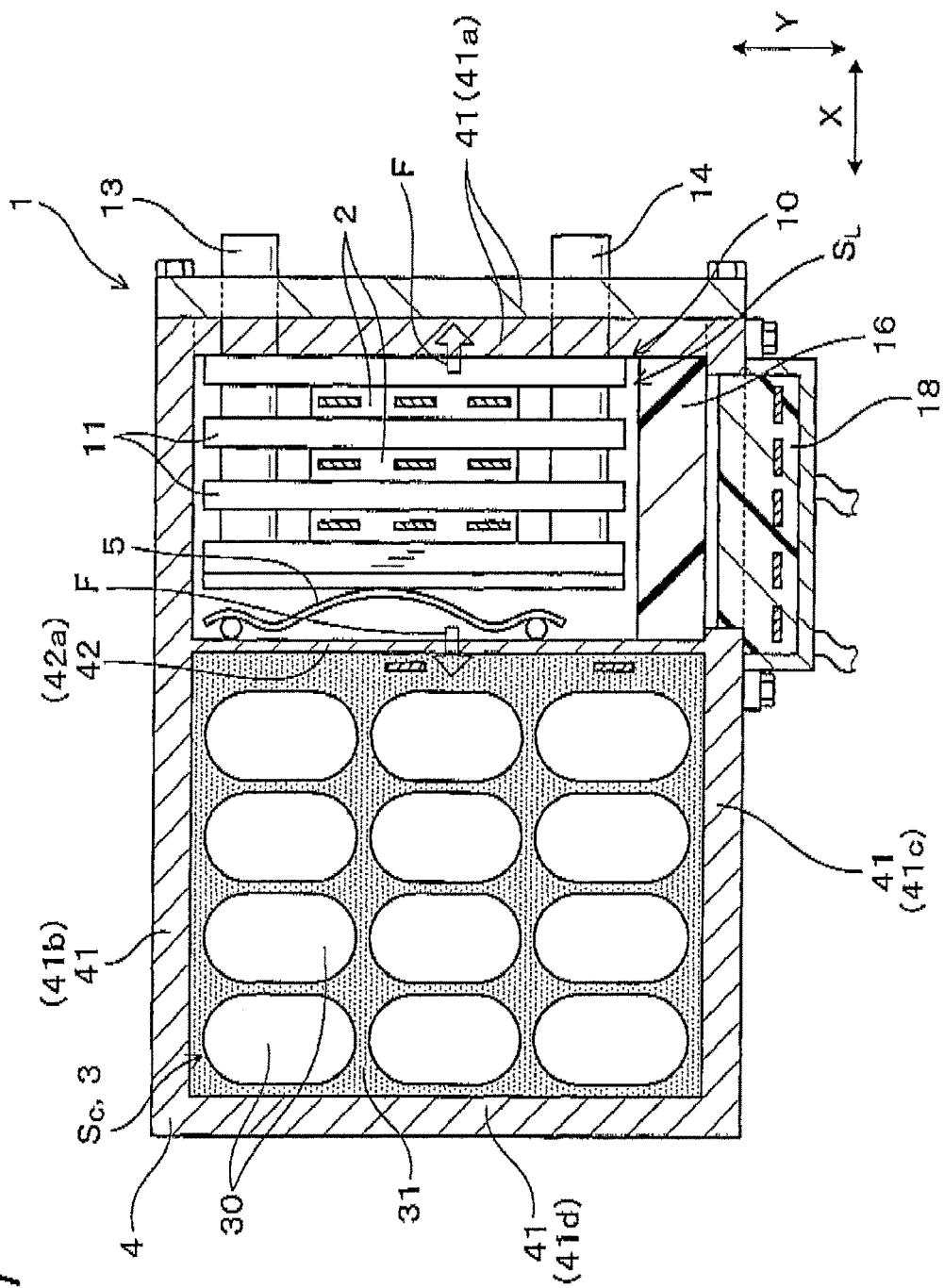
FIG. 7 shows a sectional view of an electric power converter in a second embodiment.

The present embodiment is an example that a shape of the case 4 is changed. As shown in FIG. 7, the interposing partition wall portion 42a is formed so as to connect two pieces of the outer wall portions 41b, 41c, in the present embodiment. The lateral partition wall portion 42c (refer to FIG. 1) is not formed in the present embodiment.

Further, the bottom partition wall portion 42b (refer to FIG. 3) is formed in the same manner as in the first embodiment in the present embodiment. A space surrounded by the interposing partition wall portion 42a, the bottom partition wall portion 42b, and three pieces of the outer wall portions 41b, 41c, 41d is defined as a capacitor housing space $S_C$. The thicknesses of the all partition wall portions 42 (42a, 42b) of the case 4 are made thinner than those of the outer wall portions 41. The remainder has the same structure, functions and effects as in the first embodiment.

Third Embodiment

Figure 8:
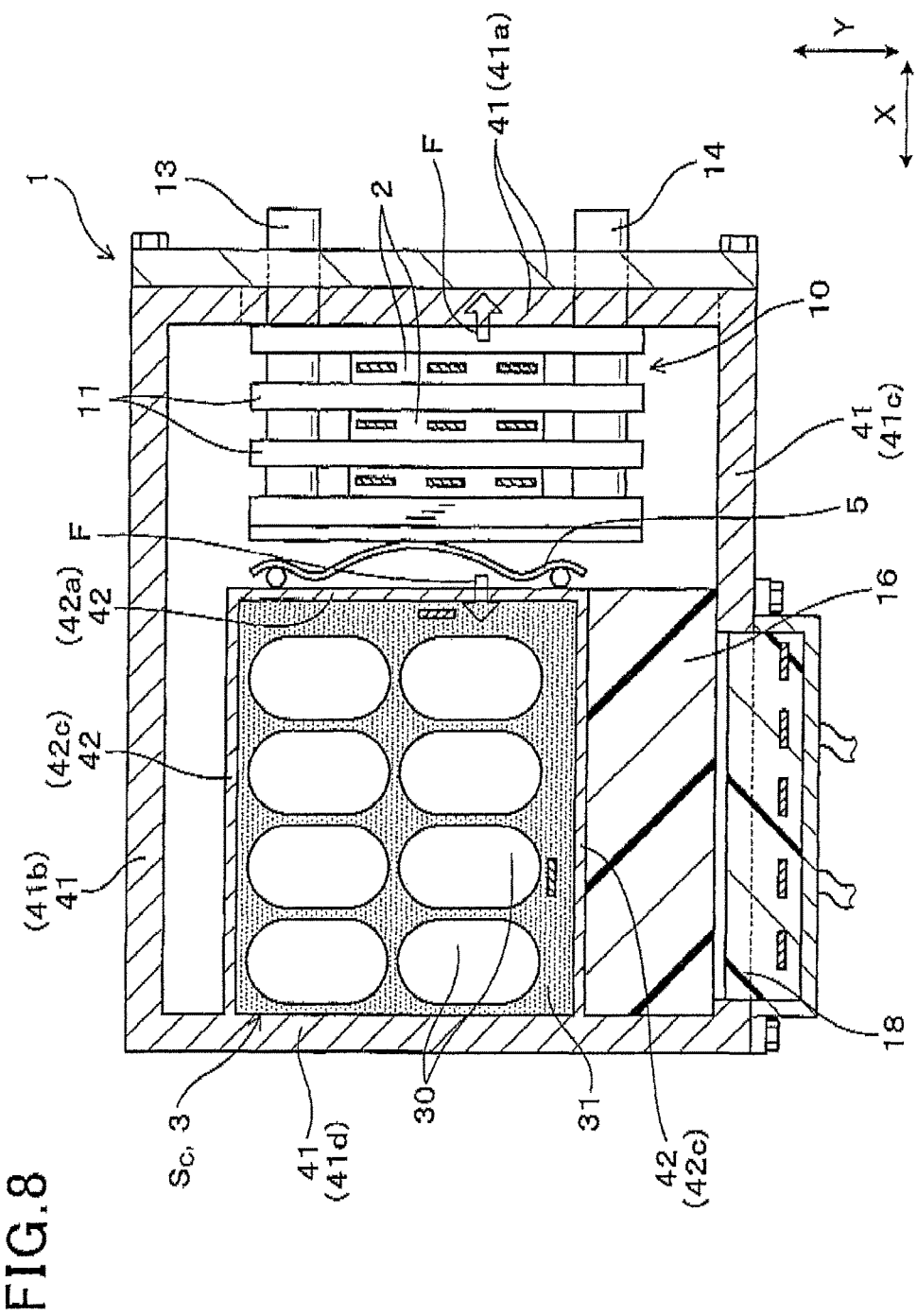
FIG. 8 shows a sectional view of an electric power converter in a third embodiment.

The present embodiment is an example that a shape of the case 4 is changed. As shown in FIG. 8, the case 4 of the present embodiment includes two lateral partition wall portions 42c. The interposing partition wall portion 42a is formed so as to connect the two lateral partition wall portions 42c.

Further, the bottom partition wall portion 42b (refer to FIG. 3) is formed in the same manner as in the first embodiment in the present embodiment. A space surrounded by the interposing partition wall portion 42a, the bottom partition wall portion 42b, two lateral partition wall portions 42c, and the supporting outer wall portions 41d is defined as a capacitor housing space $S_C$. The thicknesses of the all partition wall portions 42 (42a, 42b, 42c) of the case 4 are made thinner than those of the outer wall portions 41. The remainder has the same structure, functions and effects as in the first embodiment.

Fourth Embodiment

Figure 9:
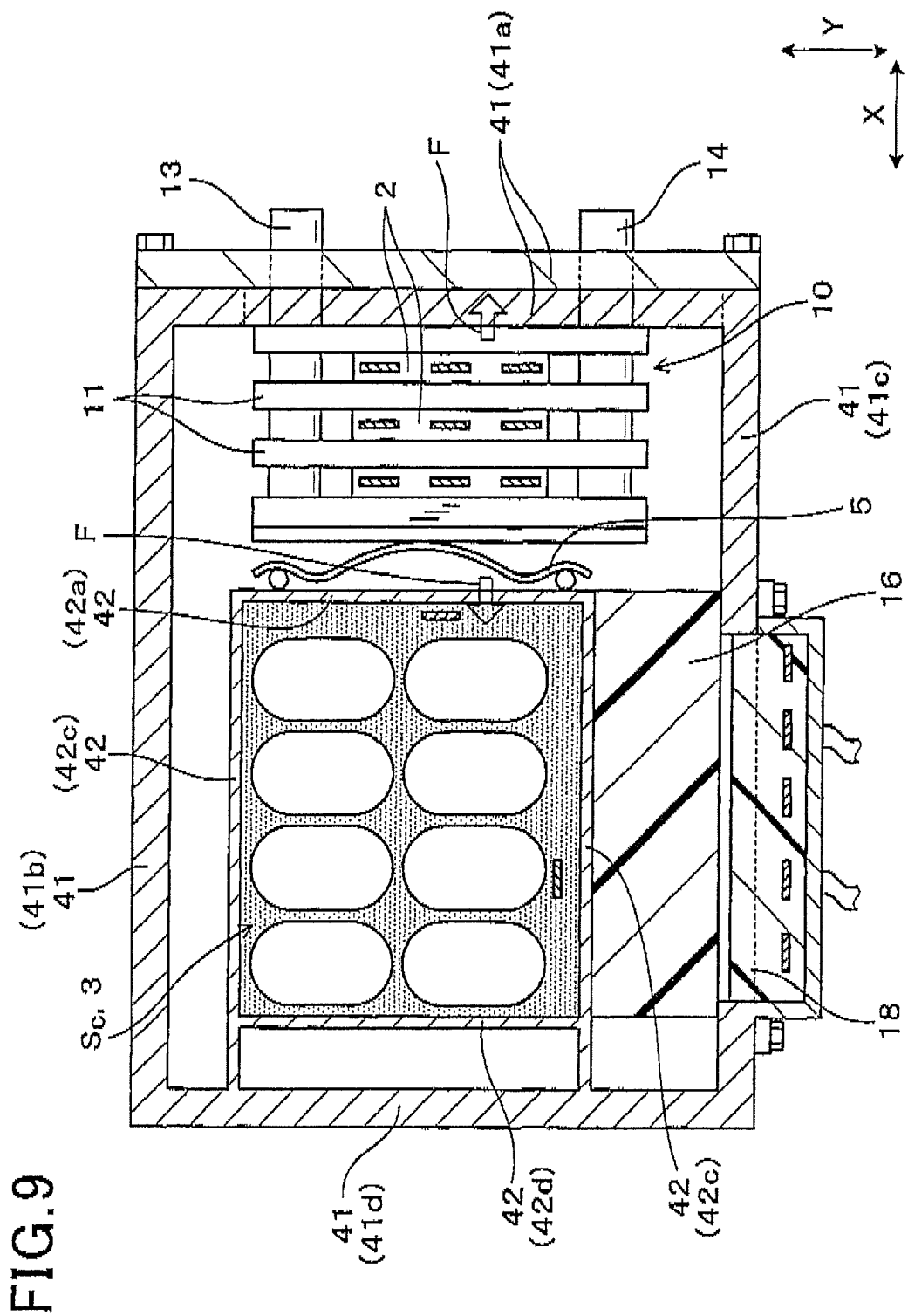
FIG. 9 shows a sectional view of an electric power converter in a fourth embodiment.

The present embodiment is an example that a shape of the case 4 is changed. As shown in FIG. 9, the case 4 of the present embodiment includes two lateral partition wall portions 42c. The interposing partition wall portion 42a is formed so as to connect the two lateral partition wall portions 42c. Further, the case 4 of the present embodiment has an opposing partition wall portion 42d disposed parallel to the interposing partition wall portion 42a. The opposing partition wall portion 42d is formed so as to connect the two lateral partition wall portions 42c.

Further, the bottom partition wall portion 42b (refer to FIG. 3) is formed in the same manner as in the first embodiment in the present embodiment. A space surrounded by the interposing partition wall portion 42a, the bottom partition wall portion 42b, two lateral partition wall portions 42c, and the opposing partition wall portion 42d is defined as a capacitor housing space $S_C$. The thicknesses of the all partition wall portions 42 (42a–42d) of the case 4 are made thinner than those of the outer wall portions 41. The remainder has the same structure, functions and effects as in the first embodiment.

What is claimed is:

1. An electric power converter comprising:
   a laminated body formed by laminating a plurality of semiconductor modules having built-in semiconductor elements and a plurality of cooling pipes for cooling the semiconductor modules disposed alternately;
   a capacitor connected to the plurality of semiconductor modules, the capacitor being disposed at a position adjacent to the laminated body in a laminating direction of the laminated body, the capacitor having:
   capacitor elements; and
   a sealing member;
   a pressing member that presses the laminated body in the laminating direction; and
   a metal case that houses the laminated body, the capacitor, and the pressing member, the metal case having:
   outer walls that form an outer shell, one of the outer walls being a supporting outer wall disposed in a position farther from the laminated body than the capacitor is in the laminating direction, the sealing member being in contact with the supporting outer wall;

partition walls formed in the metal case that are connected to the outer walls;

a space within the metal case that is partitioned by the partition walls into a capacitor housing space for housing the capacitor and a laminated body housing space for housing the laminated body, the capacitor housing space housing the capacitor elements, and the sealing member filling the capacitor housing space for sealing the capacitor elements; and an interposing partition wall to which the pressing member applies pressing force, the interposing partition wall interposing between the laminated body and the capacitor among the partition walls in a thickness direction of the interposing partition wall, a thickness of the interposing partition wall being thinner than that of any of the outer walls.

2. The electric power converter according to claim 1, further comprising:

a bottom partition wall that is orthogonal to the interposing partition wall and is disposed on a side opposite to an opening of the capacitor housing space; and a lateral partition wall that is orthogonal to both the interposing partition wall and the bottom partition wall, wherein the bottom partition wall and the lateral partition wall are provided as the partition walls, and thicknesses of the bottom partition wall and the lateral partition wall are thinner than that of any of the outer walls.

* * * * *